United States Patent
Cho et al.

(10) Patent No.: US 7,350,120 B2
(45) Date of Patent: Mar. 25, 2008

(54) BUFFERED MEMORY MODULE AND METHOD FOR TESTING SAME

(75) Inventors: Jeong-Hyeon Cho, Seoul (KR); Byung-Se So, Seongnam (KR); Jae-Jun Lee, Yongin (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 615 days.

(21) Appl. No.: 10/833,322

(22) Filed: Apr. 28, 2004

(65) Prior Publication Data

US 2004/0264269 A1 Dec. 30, 2004

(30) Foreign Application Priority Data

Jun. 24, 2003 (KR) .................... 10-2003-0041261

(51) Int. Cl.
*G11C 29/00* (2006.01)
*G01R 31/02* (2006.01)

(52) U.S. Cl. .................... 714/718; 324/754; 324/763
(58) Field of Classification Search ................ 714/718
See application file for complete search history.

(56) References Cited

U.S. PATENT DOCUMENTS

| 5,757,201 | A | 5/1998 | Partridge et al. |
| 6,094,056 | A | 7/2000 | Bardsley et al. |
| 6,490,188 | B2 * | 12/2002 | Nuxoll et al. .................. 365/63 |
| 6,700,398 | B1 * | 3/2004 | Co et al. ..................... 324/765 |
| 6,853,211 | B2 * | 2/2005 | Doherty et al. ............. 324/765 |
| 2004/0041556 | A1 * | 3/2004 | Martin et al. ............ 324/158.1 |
| 2005/0105350 | A1 * | 5/2005 | Zimmerman ................ 365/201 |
| 2005/0259504 | A1 * | 11/2005 | Murtugh et al. ............ 365/233 |

FOREIGN PATENT DOCUMENTS

| KR | 100235222 B | 12/1999 |
| KR | 10200000007258 A | 7/2000 |
| KR | 10200100010001 A | 5/2001 |
| KR | 1020010036199 A | 7/2001 |

\* cited by examiner

*Primary Examiner*—James C. Kerveros
(74) *Attorney, Agent, or Firm*—Valentine & Whitt, PLLC

(57) ABSTRACT

A buffered memory module includes a buffer circuit mounted and a plurality of memory devices mounted on the first surface of the board, the memory devices being electrically connected to the buffer circuit. The memory module also includes a plurality of test pads located on a second surface of the board and electrically connected to the buffer circuit.

12 Claims, 6 Drawing Sheets

BUFFERED MEMORY MODULE AND METHOD FOR TESTING SAME

BACKGROUND OF THE INVENTION

1. Field of the Invention

The present invention generally relates to a buffered memory module and a method for testing same. More particularly, the present invention relates to a buffered memory module in which individual memory devices can be readily tested using a probe type testing method.

A claim of priority is made to Korean Patent Application No. 2003-41261 filed on Jun. 24, 2003, in the Korean Intellectual Property Office, the disclosure of which is hereby incorporated by reference.

2. Description of Related Art

Memory modules are commonly used to operably configure multiple memory devices. Memory modules are often buffered to protect components within the module and/or to condition signals received by the module. Buffer circuits incorporated within semiconductor devices, such as memory modules, come in many forms, but generally receive an input signal and thereafter output the communicate the buffer input signal to an internal circuit. Thus, in a buffered memory module, the input signal, or some portion of the input signal, is transmitted through the buffer circuit. The data lines and components forming a semiconductor memory device can be effectively isolated using a buffer circuit. That is, signals applied to the data lines can be buffered. By buffering signals applied to the data line the problem of signal attenuation can be reduced, since buffering tends to alleviate problems associated with bus channel loading.

In spite of these advantages, buffered memory modules suffer from several shortcomings. First, the buffered memory module is relatively costly, since it incorporates separate buffer circuitry. Second, I/O signals communicated through a buffer circuit are delayed by some period of time. Third, it is difficult to test the individual memory devices once they are configured as part of a memory module.

The first shortcoming is not a significant problem in high-end applications where performance considerations outweigh cost considerations. The second shortcoming can be addressed by increasing the transmission speed of I/O signals between an external memory controller and the buffer circuit, or by temporally optimizing the signal transmission protocol used to communicate I/O signals to the buffer. However, the third shortcoming noted above is not so easily overcome.

FIG. 1 is a schematic view illustrating a conventional memory module lacking a buffer. The memory module 10 of FIG. 1 includes a memory controller 12, a plurality of semiconductor memory devices 14, and a board 16. The plurality of semiconductor memory devices 14 as arranged on board 16 to form the memory module are respectively connected to corresponding edge taps TAP1 through TAPn. Data is input and/or output between the plurality of semiconductor memory devices 14 and a memory bus (not shown) via the corresponding edge taps. Therefore, as shown in FIG. 1, for memory module 10, which lacks a buffer, it is relatively easy to access individual semiconductor memory devices. This ease of access greatly facilitates the testing of the individual memory devices. That is, since the data pins of the respective memory devices are directly connected to corresponding edge taps in a one-for-one manner, the individual memory devices arranged on memory module 10 can be readily tested by connecting test instrumentation, such as signal probes, to the edge taps. FIG. 2 is a schematic view illustrating a conventional memory module including a buffer. The memory module 20 of FIG. 2 includes a buffer circuit 22 connecting a plurality of memory devices 24 that are arranged on a board 26. Board 26 includes edge taps TAP1 through TAPn. In the buffered memory module 20 of FIG. 2, individual memory devices 24 are not connected directly to the edge taps TAP1 through TAPn, but are isolated by buffer circuit 22. That is, signal transmissions between the memory devices 24 and edge taps TAP1 through TAPn are made, without exception, through buffer circuit 22. Therefore, unlike memory module 10 of FIG. 1, the individual memory devices on buffered memory module 20 of FIG. 2 are not susceptible to testing using relatively simple test methods that require the connection of instrumentation, such as signal probes, to edge taps TAP1 through TAPn.

SUMMARY OF THE INVENTION

In one aspect, the present invention provides a buffered memory module designed in such a way that individual memory devices mounted on the module are readily susceptible to testing using probe type testing methods. In a related aspect, the present invention provides a test method for testing the individual memory devices at various stages during assembly of the memory module.

In another aspect, the present invention provides a buffered memory module, comprising; a board, a buffer circuit mounted on a first surface of the board, a plurality of semiconductor memory devices mounted on the first surface of the board and electrically connected to the buffer circuit, and a plurality of test pads mounted on a second surface of the board and electrically connected to the buffer circuit.

In yet another aspect, the present invention provides a buffered memory module comprising; a board, a buffer circuit mounted on a first surface of the board, a plurality of semiconductor memory devices mounted on first and second surfaces of the board and electrically connected to a first surface of the buffer circuit, and a plurality of test pads located on a second surface of the buffer circuit.

In still another aspect, the present invention provides a method of testing a buffered memory module having a composition as described in the foregoing two pragraphes where the method comprises the steps of connecting a plurality of extension pins mounted on a test fixture to the plurality of test pads, and thereafter testing each one of the plurality of semiconductor memory devices. This test method may applied to the memory module during a first stage of memory module assembly before the buffer circuit is mounted on the board, and/or during a second stage of memory module assembly after the buffer circuit is mounted on the board.

BRIEF DESCRIPTION OF THE DRAWINGS

The present invention and selected advantages thereof are described below with reference to the following detailed description taken in conjunction with the accompanying drawings, in which like reference numerals denote like parts. The drawings include.

DETAILED DESCRIPTION OF PREFERRED EMBODIMENTS

Reference will now be made in several preferred embodiments of the present invention, as illustrated in the accompanying drawings.

A buffered memory module implemented in accordance with the present invention may be effectively tested at two distinct stages during its assembly process. In a first assembly stage, memory module testing occurs once all semiconductor memory devices and related components are mounted on a board, but before the buffer is mounted. Alternatively, in a second stage of assembly, the memory module is tested after the buffer is mounted.

Figure 1:
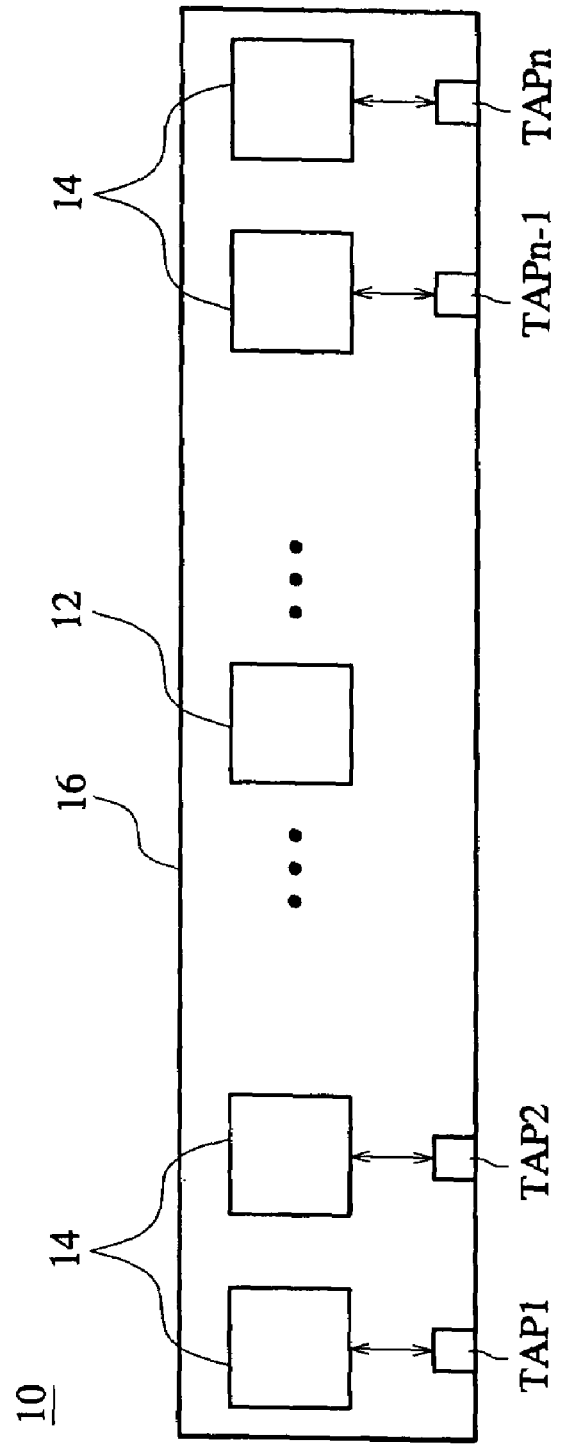
FIG. 1 is a schematic view illustrating a conventional memory module having no buffer.
Figure 2:
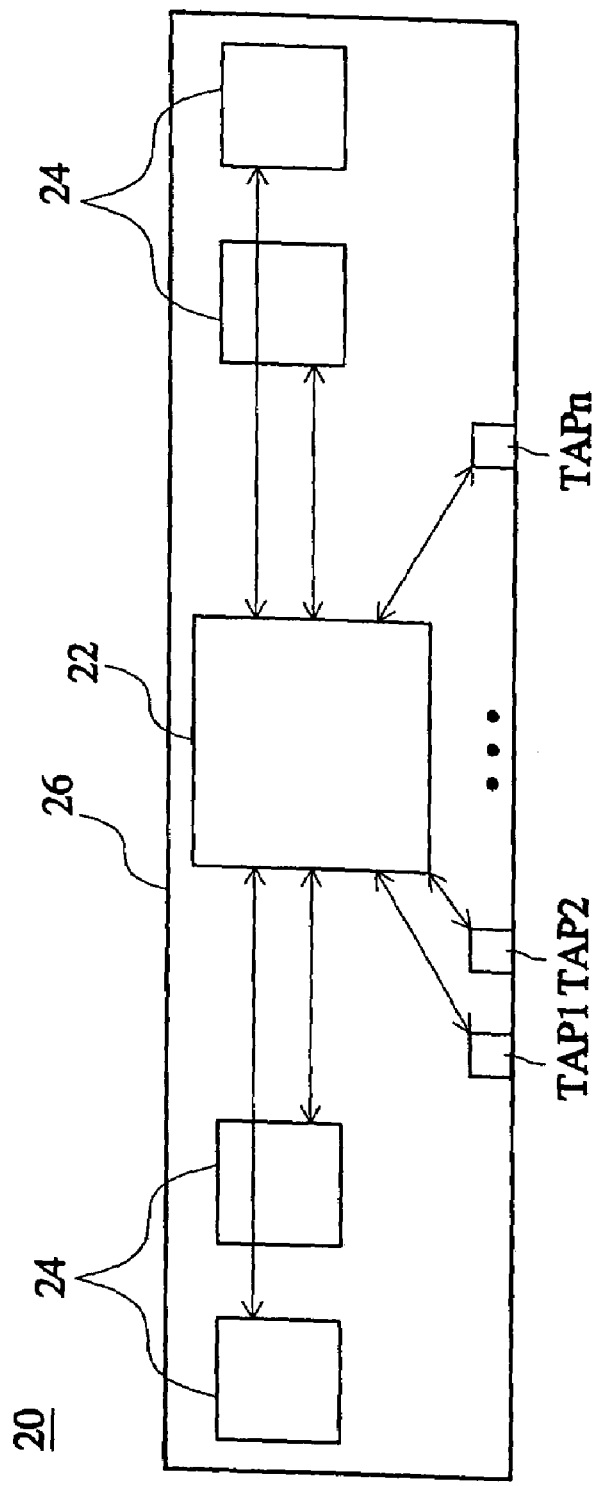
FIG. 2 is a schematic view illustrating a conventional memory module having a buffer.
Figure 3:
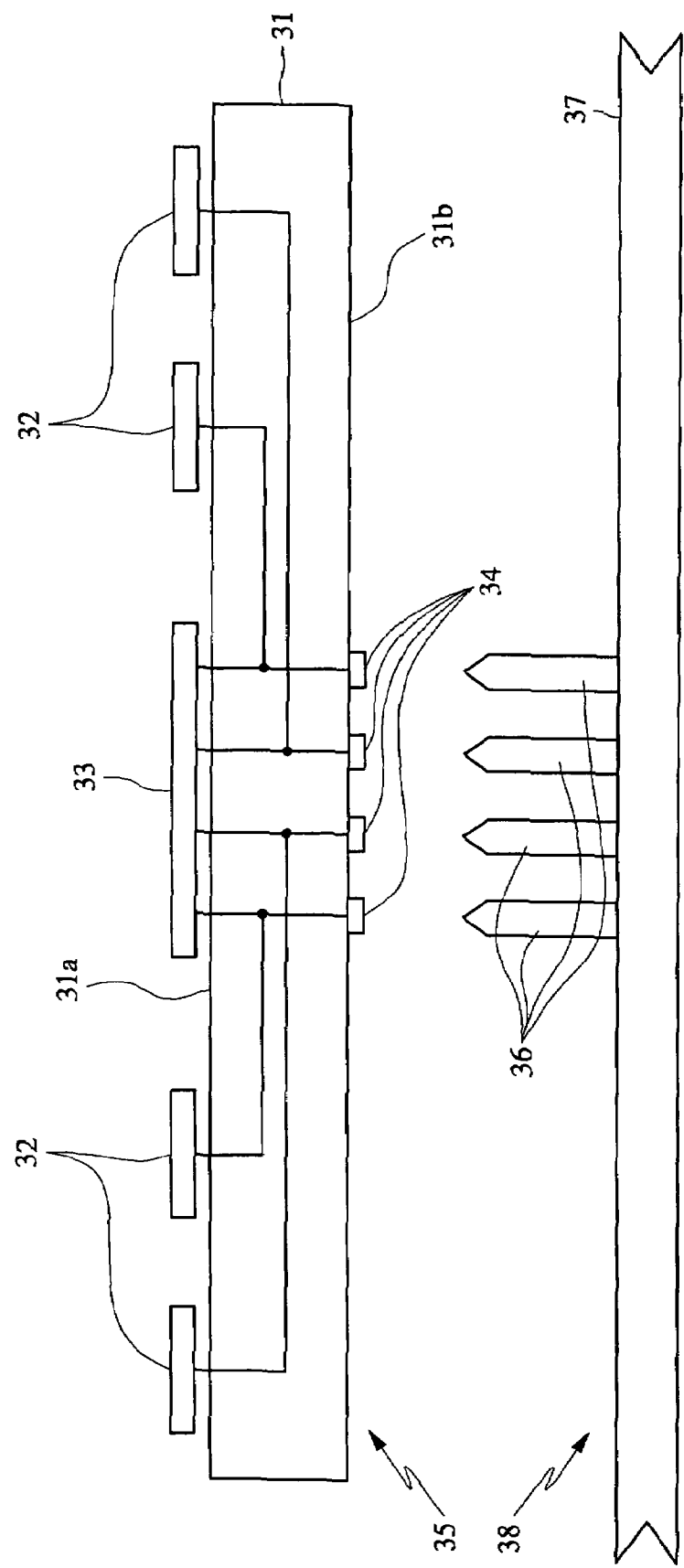
FIG. 3 is a schematic view illustrating a SIMM (single-in-line memory module) type memory module and a test fixing device according to one embodiment of the present invention.

FIG. 3 is a schematic view illustrating a SIMM (single-in-line memory module) type memory module 35 and a test fixture 38. In FIG. 3, the SIMM type memory module 35 includes a board 31, a buffer circuit 33 mounted on a first surface 31a of board 31, a plurality of semiconductor memory devices 32 mounted on the first surface 31a of board 31, and a plurality of test pads 34 mounted on a second (opposing) surface 31b of board 31. Test pads 34 are electrically connected to buffer circuit 33 through board 31. Also, each one of test pads 34 is electrically connected to a corresponding one of semiconductor memory devices 32.

The test fixture 38 preferably includes a board 37 mounting extension pins 36. Preferably, board 37 is a printed circuit board (PCB), and extension pins 36 are pogo type pins.

Since test pads 34 are mounted on the second surface 31b of board 31 and are each electrically connected to a corresponding one of semiconductor memory devices 32 mounted on the first surface 31a of board 31, the plurality of semiconductor memory devices 32 can be tested by probing test pads 34 using the pogo type extension pins 36 on test fixture 38

Figure 4:
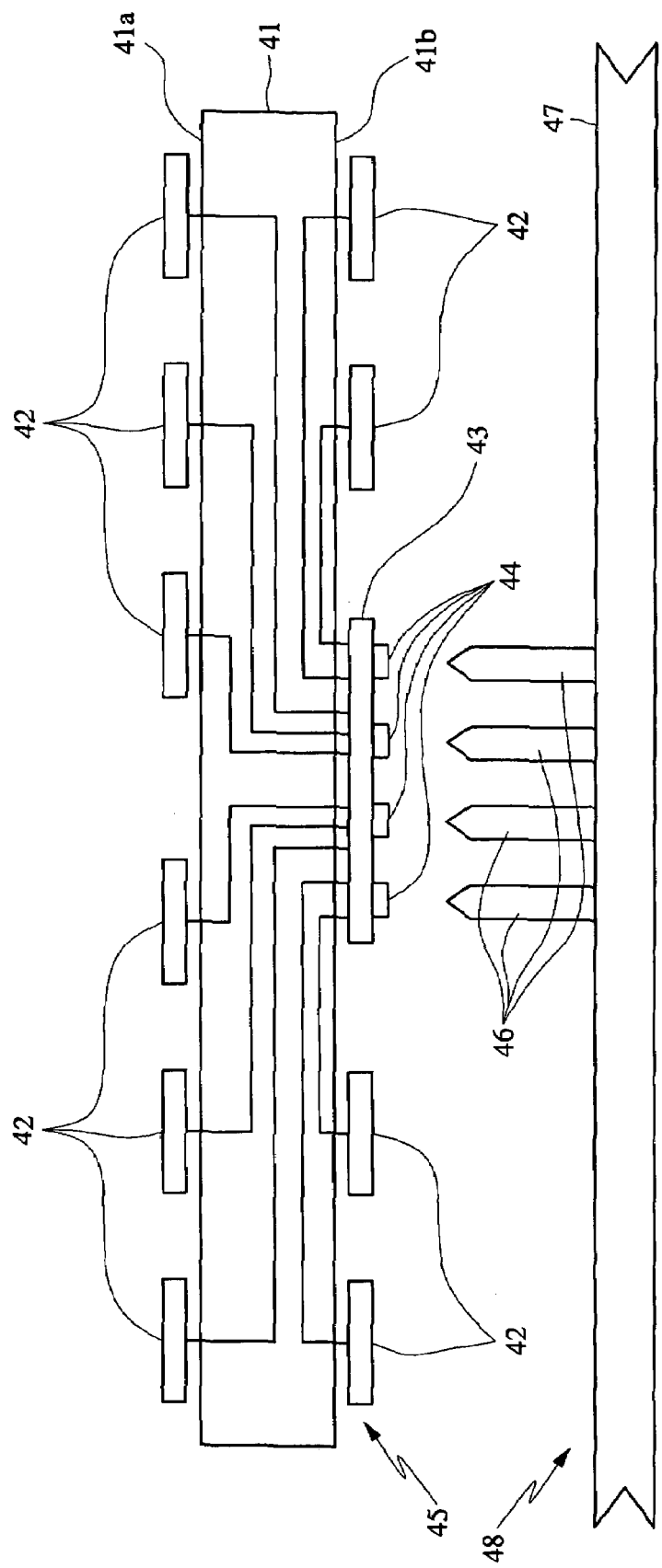
FIG. 4 is a schematic view illustrating a DIMM (double-in-line memory module) type memory module and a test fixing device according to another embodiment of the present invention.

FIG. 4 is a schematic view illustrating a DIMM (double-in-line memory module) type memory module 45 and a test fixture 48. In FIG. 4, DIMM type memory module 45 includes a board 41, a plurality of semiconductor memory devices 42 mounted first and second surfaces 41a and 41b of board 41, and a buffer circuit 43 mounted on the second surface 41b of the board 41. A plurality of semiconductor memory devices 42 are electrically connected to buffer circuit 43, and a plurality of test pads 44 are mounted on a second surface of buffer circuit 43, opposite a first surface of buffer circuit 43 proximate the second surface 41b of board 41. Test fixture 48, generally including a board 47 and extension pins 46, is similarly constructed as the test fixture described above in relation to the SIMM type memory module shown in FIG. 3.

Since test pads 44 mounted on the second surface of buffer 43 and are electrically respectively connected to corresponding ones of the semiconductor memory devices 42 mounted on the first and second surfaces 31a and 41a, the semiconductor memory devices 42 can be tested by probing via test pads 44 using the pogo type extension pins 46 on test fixture 48.

Figure 5:
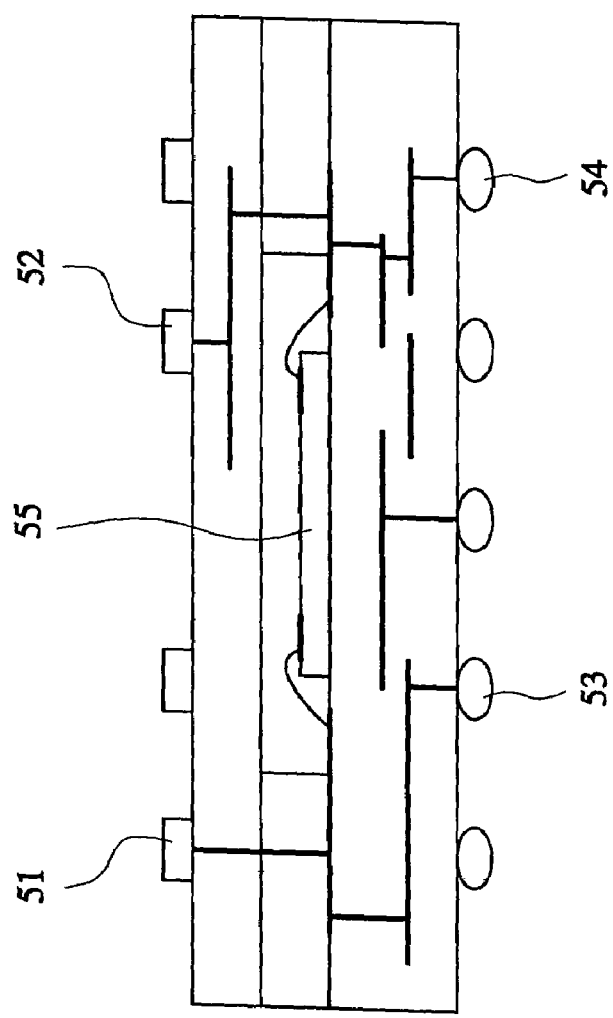
FIG. 5 is a cross-sectional view illustrating a buffer circuit of one embodiment of the DIMM type memory module of FIG. 4.

FIG. 5 is a cross-sectional view further illustrating a buffer circuit of one embodiment adapted for use within the context of the DIMM type memory module 43 of FIG. 4. Buffer circuit 43 includes a semiconductor buffer die 55, test pads 51 and 52, and buffer pins 53 and 54. Semiconductor buffer die 55 is surrounded by a package molding. Buffer pins 53 and 54 are electrically connected to the corresponding semiconductor memory devices (42 in FIG. 4) respectively. Buffer pins 53 and 54 are respectively connected to test pads 51 and 52, such that respective semiconductor memory devices can be tested by probing test pads 51 and 52.

Figure 6:
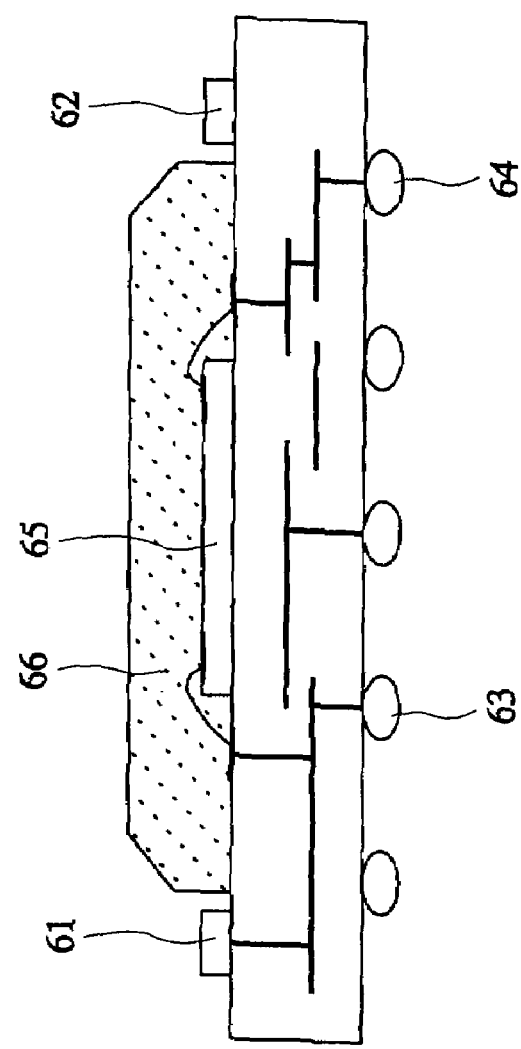
FIG. 6 is a cross-sectional view illustrating a buffer circuit of another embodiment of the DIMM type memory module of FIG. 4.

FIG. 6 is a cross-sectional view further illustrating a buffer circuit of another embodiment adapted for use within the context of the DIMM type memory module 43 of FIG. 4. Buffer circuit 33 includes a semiconductor buffer die 65, test pads 61 and 62, and buffer pins 63 and 64. Semiconductor buffer die 55 is encapsulated within a conventional encapsulation material 66. Buffer pins 63 and 64 are electrically connected to corresponding semiconductor memory devices (42 in FIG. 4) respectively. Buffer pins 63 and 64 are respectively connected to test pads 61 and 62, such that respective semiconductor memory devices can be tested by probing test pads 61 and 62.

As described above, a buffered memory module designed according to the present invention, is more readily susceptible to testing using probe type testing applied to constituent test pads. Thus, individual semiconductor memory devices can be effectively tested using test methods using simple probes.

While the present in invention has been particularly shown and described with reference to certain preferred embodiments, it will be understood by those skilled in the art that the foregoing and other changes in form and details may be made therein without departing from the spirit and scope of the invention.

What is claimed is:

1. A buffered memory module, comprising:
    a board including oppositely facing first and second surfaces on respective opposite sides of the board;
    a buffer circuit mounted on the first surface of the board;
    a plurality of semiconductor memory devices mounted on the first surface of the board and electrically connected to the buffer circuit; and
    a plurality of test pads mounted on the second surface of the board and electrically connected to the buffer circuit;
    wherein the plurality of semiconductor memory devices are respectively tested by probing the test pads using extension pins mounted on a test fixture.

2. The module of claim 1, wherein the buffer circuit further comprises I/O pads and wherein each one of the plurality of semiconductor memory devices further comprises signal pads, wherein the signal pads of the plurality of semiconductor memory devices are electrically connected to respective I/O pads of the buffer circuit.

3. The module of claim 1, wherein the buffered memory module is a SIMM type memory module.

4. A buffered memory module, comprising:
a board including oppositely facing first and second surfaces on respective opposite sides of the board;
a buffer circuit mounted on the first surface of the board, the buffer circuit including oppositely facing first and second surfaces on opposite sides of the buffer circuit, wherein the first surface of the buffer circuit faces towards the first surface of the board;
a plurality of semiconductor memory devices mounted on the first and second surfaces of the board and electrically connected to the first surface of the buffer circuit; and
a plurality of test pads located on the second surface of the buffer circuit;
wherein the test pads are electrically connected to the corresponding semiconductor memory devices, respectively.

5. The module of claim 4, wherein the buffered memory module is a DIMM type memory module.

6. The module of claim 4, wherein the buffer circuit further comprises I/O pads and wherein each one of the plurality of semiconductor memory devices further comprises signal pads, wherein the signal pads of the plurality of semiconductor memory devices are electrically connected to respective I/O pads of the buffer circuit.

7. A method of testing a buffered memory module, the method comprising:

connecting a plurality of extension pins mounted on a test fixture to a plurality of test pads located on a second surface of a board and electrically connected to a buffer circuit mounted on a first surface of the board, the first and second surfaces facing in opposite directions from each other on respective opposite sides of the board; and, thereafter, testing each one of a plurality of semiconductor memory devices mounted on the first surface of the board and electrically connected to the buffer circuit.

8. The method of claim 7, wherein each one of the plurality of semiconductor memory devices is tested during a first stage of memory module assembly before the buffer circuit is mounted on the board.

9. The method of claim 8, wherein the memory module is a DIMM type memory module.

10. The method of claim 7, wherein each one of the plurality of semiconductor memory devices is tested during a second stage of memory module assembly after the buffer circuit is mounted on the board.

11. The method of claim 7, wherein the extension pins are pogo type pins.

12. The method of claim 7, wherein the memory module is a SIMM type memory module.

* * * * *